(12) United States Patent
Sharma et al.

(10) Patent No.: US 12,307,177 B2
(45) Date of Patent: May 20, 2025

(54) AUTO GENERATION OF DEBUG TRACE IN PRE-SILICON VERIFICATION

(71) Applicant: International Business Machines Corporation, Armonk, NY (US)

(72) Inventors: Shailesh Sharma, Uttar Pradesh (IN); Madhusudan Kadiyala, Bangalore (IN)

(73) Assignee: International Business Machines Corporation, Armonk, NY (US)

( * ) Notice: Subject to any disclaimer, the term of this patent is extended or adjusted under 35 U.S.C. 154(b) by 610 days.

(21) Appl. No.: 17/578,741

(22) Filed: Jan. 19, 2022

(65) Prior Publication Data
US 2023/0229837 A1    Jul. 20, 2023

(51) Int. Cl.
G06F 30/30 (2020.01)
G06F 30/3308 (2020.01)
G06F 30/3323 (2020.01)

(52) U.S. Cl.
CPC ...... *G06F 30/3308* (2020.01); *G06F 30/3323* (2020.01)

(58) Field of Classification Search
None
See application file for complete search history.

(56) References Cited

U.S. PATENT DOCUMENTS

| | | | |
|---|---|---|---|
| 3,715,573 A * | 2/1973 | Vogelsberg | G06F 11/261 714/33 |
| 5,499,371 A | 3/1996 | Henninger et al. | |
| 5,699,310 A | 12/1997 | Garloff et al. | |
| 6,477,683 B1 | 11/2002 | Killian et al. | |
| 6,876,314 B1 | 4/2005 | Lin | |
| 7,143,373 B2 * | 11/2006 | Moorby | G06F 30/33 716/106 |
| 9,021,409 B2 * | 4/2015 | Vasudevan | G06F 30/3323 716/108 |
| 9,069,574 B2 * | 6/2015 | Greiner | G06F 8/4441 |
| 9,734,263 B2 | 8/2017 | Kohavi et al. | |
| 11,579,195 B2 * | 2/2023 | Ting | G06F 13/1668 |
| 2006/0259878 A1 | 11/2006 | Killian et al. | |
| 2014/0181767 A1 | 6/2014 | Kohavi | |
| 2014/0250429 A1 | 9/2014 | Greiner et al. | |
| 2020/0158781 A1 | 5/2020 | Ting et al. | |

FOREIGN PATENT DOCUMENTS

| | | |
|---|---|---|
| CN | 102957553 B | 4/2018 |
| CN | 112667219 A | 4/2021 |

\* cited by examiner

*Primary Examiner* — Leigh M Garbowski
(74) *Attorney, Agent, or Firm* — Randy Tejeda

(57) ABSTRACT

Embodiments are for auto generation of a debug trace in pre-silicon verification. A configuration file is created that includes fail information of a fail related to at least one failed interface of a design. A Boolean expression is generated to represent interface signals of the at least one failed interface, the configuration file comprising the interface signals of the least one failed interface. Responsive to determining that the Boolean expression meets a condition for complexity of the Boolean expression, code is automatically generated related to the fail based on the configuration file in preparation for a simulation of the failed interface in the design. A simulation of the design is run based at least in part on the code to generate a debug trace for the fail of the at least one failed interface.

20 Claims, 11 Drawing Sheets

CONFIGURATION FILE FORMAT

```
{
  "Behavior": "Behavior 1",
  "Category": "1-simple",
  "Number of event signals": "1",
  "Input Source1": "<Input Signal 1>",
  "Input Source 1 Width": "<width>",
  "Number of Output Signals": "1",
  "Output Source 1": "<Output Signal 1>",
  "Output Source 1 Width": "<width>",
  "Output Source 1 cycle delay": "0"
}
```

FIG. 5

CONFIGURATION FILE FORMAT

{
"Behavior": "Behavior 2",
"Category": "2-complex",
"Number of event signals": "2"
"Input Source 1": "<Input Signal 1>"
"Input Source Width 1": "<width>"
"Input Source 2": "<Input Signal 2>"
"Input Source 2 cycle delay": "1"
"Input Source Width 2": "<width>"
"Number of Output Signals": "2",
"Output Source 1": "",
"Output Source 1: "<Output Signal 1>"
"Output Source 1 cycle delay": "2"
"Output Source 2": "<Output Signal 2>"
"Output Source 2 Width": "<width>"
"Output Source 2 cycle delay": "3"
}

FIG. 11

-DEBUG TRACE TEXT FILE EXAMPLE-

Cyc 0002557: s0.g0.c0.ex00.ec < Event happened related to Input Signals >: Valid: 1
<Output Signal 1>: 0x028  <Output Signal 2>: 0x000048944c9ea000

AUTO GENERATION OF DEBUG TRACE IN PRE-SILICON VERIFICATION

BACKGROUND

The present invention generally relates to fabrication methods and resulting structures for integrated circuits, and more specifically, to fabrication methods and resulting structures configured and arranged for auto generation of a debug trace in pre-silicon verification.

In the context of hardware and software systems, formal verification is the act of proving or disproving the correctness of an intended design underlying a system with respect to a certain formal specification or property. Functional verification is the process of demonstrating the functional correctness of a design with respect to the design specifications. Functional verification does not confirm the correctness of the design specification and assumes that the design specification is correct. Functional verification is considered an important process in the integrated circuit (IC) design cycle because the design has to be functionally verified so that any potential bug is eliminated at an early stage.

SUMMARY

Embodiments of the present invention are directed to methods for auto generation of a debug trace in pre-silicon verification of a design of an IC. A non-limiting example method includes creating a configuration file that includes fail information of a fail related to at least one failed interface of a design and generating a Boolean expression to represent interface signals of the at least one failed interface, the configuration file comprising the interface signals of the least one failed interface. The method includes responsive to determining that the Boolean expression meets a condition for complexity of the Boolean expression, automatically generating code related to the fail based on the configuration file in preparation for a simulation of the failed interface in the design. The method includes running a simulation of the design based at least in part on the code to generate a debug trace for the fail of the at least one failed interface.

Other embodiments of the present invention implement features of the above-described method in computer systems and computer program products.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 4 depicts a block diagram of a configuration file according to one or more embodiments of the present invention;

FIG. 5 depicts a block diagram of a configuration file according to one or more embodiments of the present invention;

FIG. 11 depicts a block diagram of an example debug trace text file according to one or more embodiments of the present invention.

DETAILED DESCRIPTION

Figure 1:
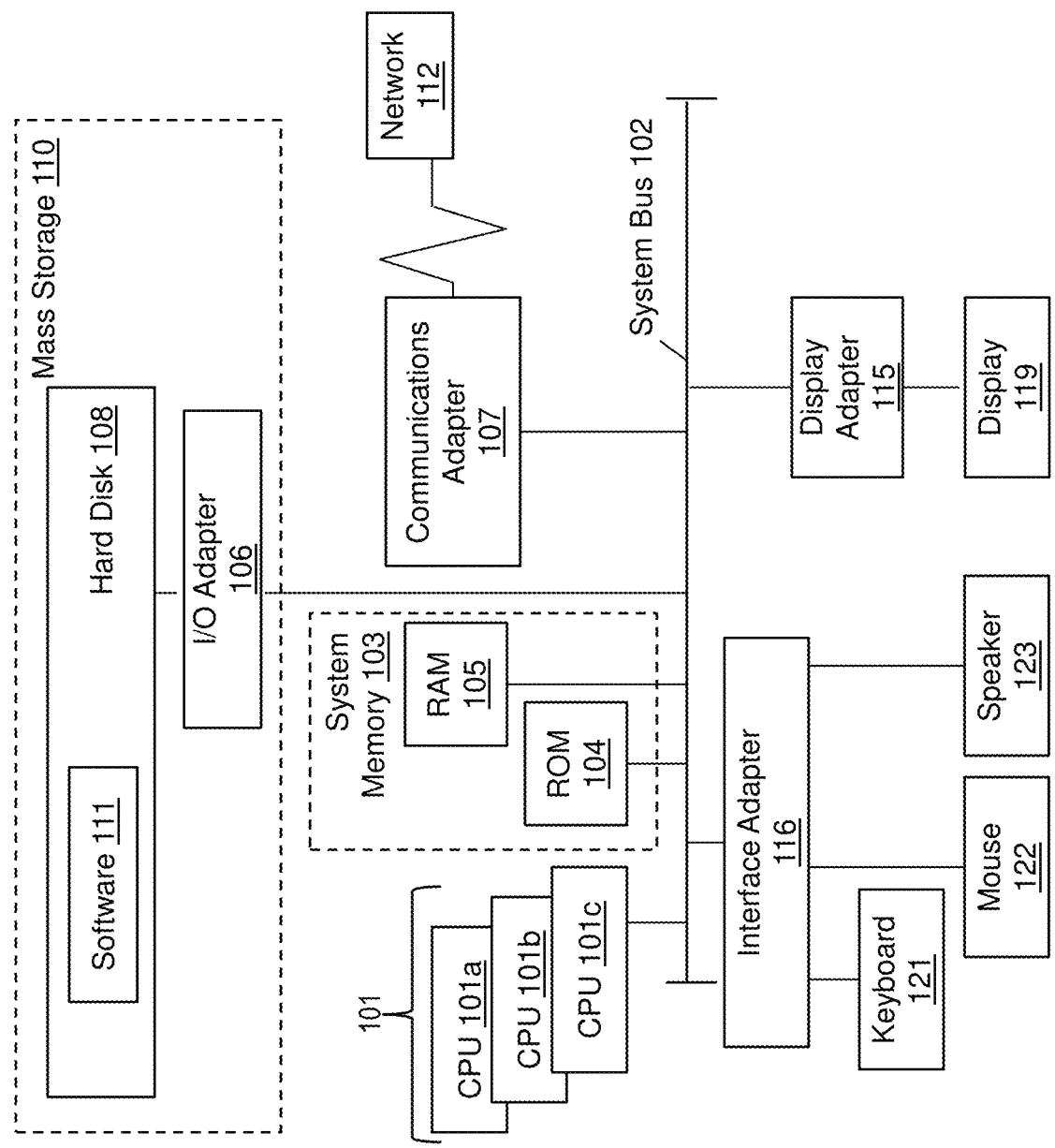
FIG. 1 depicts a block diagram of an example computer system for use in conjunction with one or more embodiments of the present invention.

One or more embodiments of the invention are configured for auto generation of a debug trace in pre-silicon verification, thereby providing debug trace information for a design of an integrated circuit (IC) in order to fabricate the IC. One or more embodiments of the invention provide a technique which simplifies the debugging process for a fail (or failure) in a functional verification of the design of the IC based on the signature (i.e., fail signature) of the fail while not adding a coding burden for other tests in the functional verification that are not related to the fail. Using this technique, an auto code generator receives (e.g., from a user) input of knowledge related to the exact behavior of the fail and then runs a script. The script of the auto code generated is configured to auto generate the required coding to produce a separate tailored trace file needed to debug the fail in addition to the traditional trace file. The generated code can be recompiled and the previously failed test is rerun for which that particular key information in the tailored trace file is required.

For the sake of brevity, conventional techniques related to semiconductor device and IC fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Debugging the fails from the functional verification is a very lengthy process which sometimes requires more time because the key information is not present in simulation trace file. The simulation trace file is huge and is not structured properly. Sometimes, while debugging the fails, one has to go through all event traces (AETs) (e.g., in a value change dump) and ask designers to obtain the information needed to find the key information that is missing from the trace file, thereby being dependent upon designers for this information. Key information is different for different types of fail signatures which may not be available in the trace file.

One or more embodiments provide a system and method for automatic generation of code to result in a debug trace based on interface (e.g., JSON (Java Script Object Notation)) signals in order to generate the code for debugging fails in pre-silicon verification. One or more embodiments are configured to represent any interface in the design (or design specification) as a "Boolean expression condition" before outputting the data from the interface data bus, interpret the Boolean expression, and generate a valid source code and/or extract the valid information from a value change dump (VCD) file. Accordingly, one or more embodiments are configured to enable faster debug information generation for fails based on the fail signature of the fail without requiring underlying knowledge of the hardware verification language to generate the code and to get a separate tailored trace file needed to debug the fails in addition to the traditional trace file. This is because the code can be recompiled and a failed test can be rerun for which that particular key information is required.

Turning now to FIG. 1, a computer system 100 is generally shown in accordance with one or more embodiments of the invention. The computer system 100 can be an electronic, computer framework comprising and/or employing any number and combination of computing devices and networks utilizing various communication technologies, as described herein. The computer system 100 can be easily scalable, extensible, and modular, with the ability to change to different services or reconfigure some features independently of others. The computer system 100 may be, for example, a server, desktop computer, laptop computer, tablet computer, or smartphone. In some examples, computer system 100 may be a cloud computing node. Computer system 100 may be described in the general context of computer system executable instructions, such as program modules, being executed by a computer system. Generally, program modules may include routines, programs, objects, components, logic, data structures, and so on that perform particular tasks or implement particular abstract data types. Computer system 100 may be practiced in distributed cloud computing environments where tasks are performed by remote processing devices that are linked through a communications network. In a distributed cloud computing environment, program modules may be located in both local and remote computer system storage media including memory storage devices.

As shown in FIG. 1, the computer system 100 has one or more central processing units (CPU(s)) 101a, 101b, 101c, etc., (collectively or generically referred to as processor(s) 101). The processors 101 can be a single-core processor, multi-core processor, computing cluster, or any number of other configurations. The processors 101, also referred to as processing circuits, are coupled via a system bus 102 to a system memory 103 and various other components. The system memory 103 can include a read only memory (ROM) 104 and a random access memory (RAM) 105. The ROM 104 is coupled to the system bus 102 and may include a basic input/output system (BIOS) or its successors like Unified Extensible Firmware Interface (UEFI), which controls certain basic functions of the computer system 100. The RAM is read-write memory coupled to the system bus 102 for use by the processors 101. The system memory 103 provides temporary memory space for operations of said instructions during operation. The system memory 103 can include random access memory (RAM), read only memory, flash memory, or any other suitable memory systems.

The computer system 100 comprises an input/output (I/O) adapter 106 and a communications adapter 107 coupled to the system bus 102. The I/O adapter 106 may be a small computer system interface (SCSI) adapter that communicates with a hard disk 108 and/or any other similar component. The I/O adapter 106 and the hard disk 108 are collectively referred to herein as a mass storage 110.

Software 111 for execution on the computer system 100 may be stored in the mass storage 110. The mass storage 110 is an example of a tangible storage medium readable by the processors 101, where the software 111 is stored as instructions for execution by the processors 101 to cause the computer system 100 to operate, such as is described herein below with respect to the various Figures. Examples of computer program product and the execution of such instruction is discussed herein in more detail. The communications adapter 107 interconnects the system bus 102 with a network 112, which may be an outside network, enabling the computer system 100 to communicate with other such systems. In one embodiment, a portion of the system memory 103 and the mass storage 110 collectively store an operating system, which may be any appropriate operating system to coordinate the functions of the various components shown in FIG. 1.

Additional input/output devices are shown as connected to the system bus 102 via a display adapter 115 and an interface adapter 116. In one embodiment, the adapters 106, 107, 115, and 116 may be connected to one or more I/O buses that are connected to the system bus 102 via an intermediate bus bridge (not shown). A display 119 (e.g., a screen or a display monitor) is connected to the system bus 102 by the display adapter 115, which may include a graphics controller to improve the performance of graphics intensive applications and a video controller. A keyboard 121, a mouse 122, a speaker 123, etc., can be interconnected to the system bus 102 via the interface adapter 116, which may include, for example, a Super I/O chip integrating multiple device adapters into a single integrated circuit. Suitable I/O buses for connecting peripheral devices such as hard disk controllers, network adapters, and graphics adapters typically include common protocols, such as the Peripheral Component Interconnect (PCI) and the Peripheral Component Interconnect Express (PCIe). Thus, as configured in FIG. 1, the computer system 100 includes processing capability in the form of the processors 101, and, storage capability including the system memory 103 and the mass storage 110, input means such as the keyboard 121 and the mouse 122, and output capability including the speaker 123 and the display 119.

In some embodiments, the communications adapter 107 can transmit data using any suitable interface or protocol, such as the internet small computer system interface, among others. The network 112 may be a cellular network, a radio network, a wide area network (WAN), a local area network (LAN), or the Internet, among others. An external computing device may connect to the computer system 100 through the network 112. In some examples, an external computing device may be an external webserver or a cloud computing node.

It is to be understood that the block diagram of FIG. 1 is not intended to indicate that the computer system 100 is to include all of the components shown in FIG. 1. Rather, the computer system 100 can include any appropriate fewer or additional components not illustrated in FIG. 1 (e.g., additional memory components, embedded controllers, modules, additional network interfaces, etc.). Further, the embodiments described herein with respect to computer system 100 may be implemented with any appropriate logic, wherein the logic, as referred to herein, can include any suitable hardware (e.g., a processor, an embedded controller, or an application specific integrated circuit, among others), software (e.g., an application, among others), firmware, or any suitable combination of hardware, software, and firmware, in various embodiments.

Figure 2:
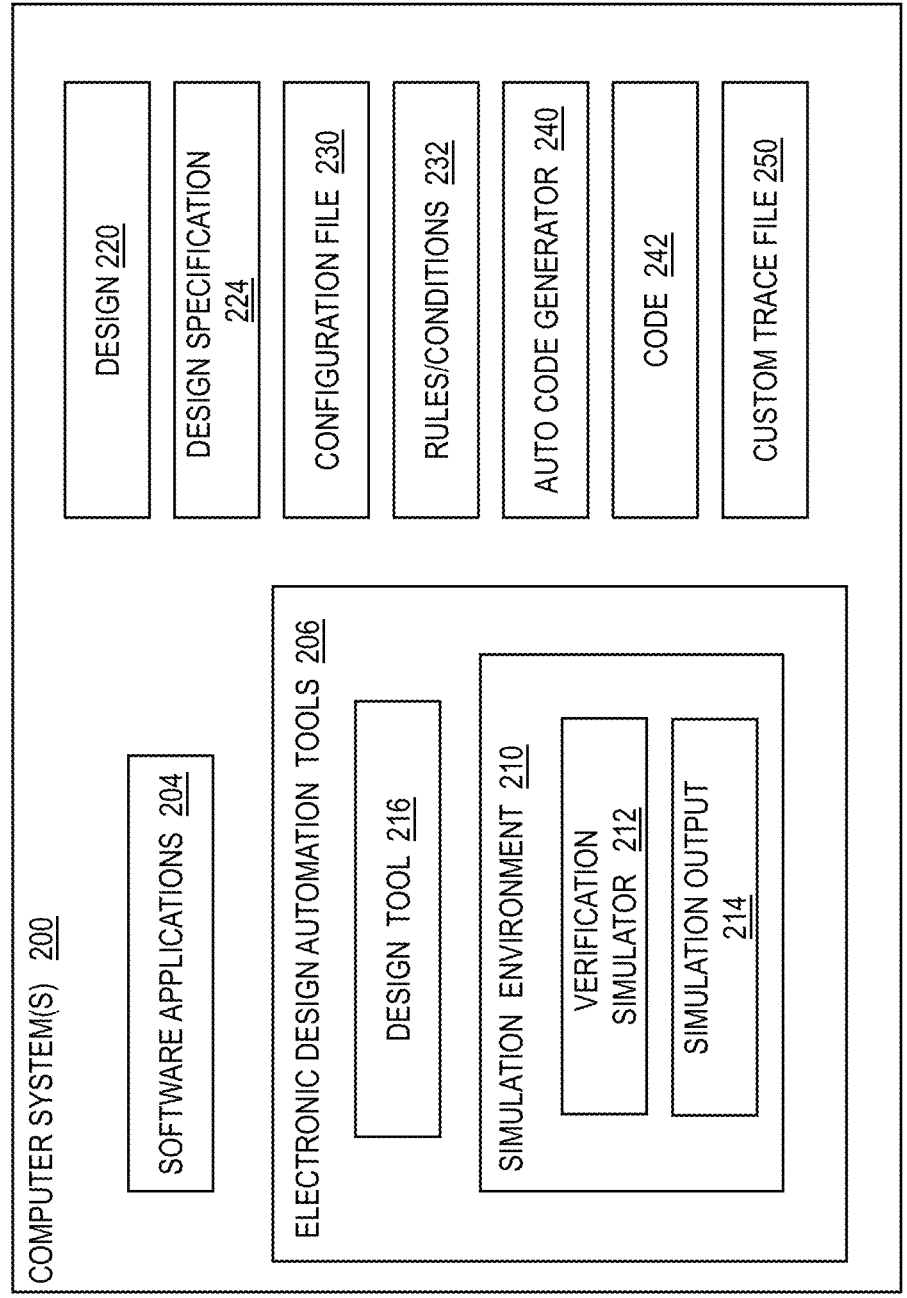
FIG. 2 is a block diagram of a computer system for auto generation of a debug trace in pre-silicon verification, thereby providing debug trace information for a design of an IC in order to fabricate the IC according to one or more embodiments of the present invention.

FIG. 2 is a block diagram of one or more computer systems 200 for auto generation of a debug trace in pre-silicon verification, thereby providing debug trace information for a design of an IC in order to fabricate the IC according to one or more embodiments of the invention. Elements of computer system 100 may be used in and/or integrated into one or more computer systems 200. Software applications 204, electronic design automation (EDA) tools 206, verification simulator 212, simulation auto code generator 240, design tool 216, etc., may be implemented as software 111 executed on one or more processors 101, as discussed in FIG. 1.

As understood by one of ordinary skill in the art, simulation of design 220 for an IC is performed using known methods and techniques. In EDA used for performing simulation, functional verification is the task of verifying that the logic design conforms to design specification (e.g., design specification 224). Functional verification attempts to answer the question "Does this proposed design do what is intended?" This is a complex task and takes the majority of time and effort in most large electronic system design projects. Functional verification is a part of more encompassing design verification, which, besides functional verification, considers non-functional aspects like timing, layout, and power. Functional verification is very difficult because of the sheer volume of possible test cases that exist in even a simple design. Frequently there are more than $10^{80}$ possible tests to comprehensively verify a design, which can be a number that is impossible to achieve in a lifetime. However, it can be attacked by many methods. None of them are perfect, but each can be helpful in certain circumstances.

Logic simulation simulates the logic before it is built. Simulation acceleration can apply special purpose hardware to the logic simulation problem. Formal verification attempts to prove mathematically that certain requirements (also expressed formally) are met, or that certain undesired behaviors (such as deadlock) cannot occur.

Simulation based verification (also called "dynamic verification") is widely used to "simulate" the design, since this method scales up very easily. Stimulus is provided to exercise each line in the hardware description language code. A test-bench is built to functionally verify the design by providing meaningful scenarios to check that given certain input, the design performs to specification.

A simulation environment is typically composed of several types of components. The generator generates input vectors that are used to search for anomalies that exist between the intent (specifications) and the implementation (hardware description language code). This type of generator utilizes an NP-complete type of SAT Solver that can be computationally expensive. Other types of generators include manually created vectors and Graph-Based generators (GBMs) proprietary generators. Modern generators create directed-random and random stimuli that are statistically driven to verify random parts of the design. The randomness is important to achieve a high distribution over the huge space of the available input stimuli. To this end, users of these generators intentionally under specify the requirements for the generated tests. It is the role of the generator to randomly fill this gap. This mechanism allows the generator to create inputs that reveal bugs not being searched for directly by the user. Generators also bias the stimuli toward design corner cases to further stress the logic. Biasing and randomness serve different goals and there are tradeoffs between them, hence different generators have a different mix of these characteristics. Since the input for the design must be valid (legal) and many targets (such as biasing) should be maintained, many generators use the constraint satisfaction problem (CSP) technique to solve the complex testing requirements. The legality of the design inputs and the biasing arsenal are modeled. The model-based generators use this model to produce the correct stimuli for the target design.

Also, the simulation environment includes the drivers that translate the stimuli produced by the generator into the actual inputs for the design under verification. Generators create inputs at a high level of abstraction, namely, as transactions or assembly language. The drivers convert this input into actual design inputs as defined in the specification of the design's interface. The simulator produces the outputs of the design, based on the design's current state (the state of the flip-flops) and the injected inputs. The simulator has a description of the design netlist. This description is created by synthesizing the hardware description language to a low gate level netlist.

Further, the simulation environment includes a monitor that converts the state of the design and its outputs to a transaction abstraction level so it can be stored in a "score-boards" database to be checked later on. The checker validates that the contents of the score-boards are legal. There are cases where the generator creates expected results, in addition to the inputs. In these cases, the checker must validate that the actual results match the expected ones. The simulation environment includes an arbitration manager that manages all the above components together. Different coverage metrics are defined to assess that the design has been adequately exercised. These include functional coverage (e.g., has every functionality of the design been exercised), statement coverage (e.g., has each line of hardware description language been exercised), and branch coverage (e.g., has each direction of every branch been exercised).

Figure 3:
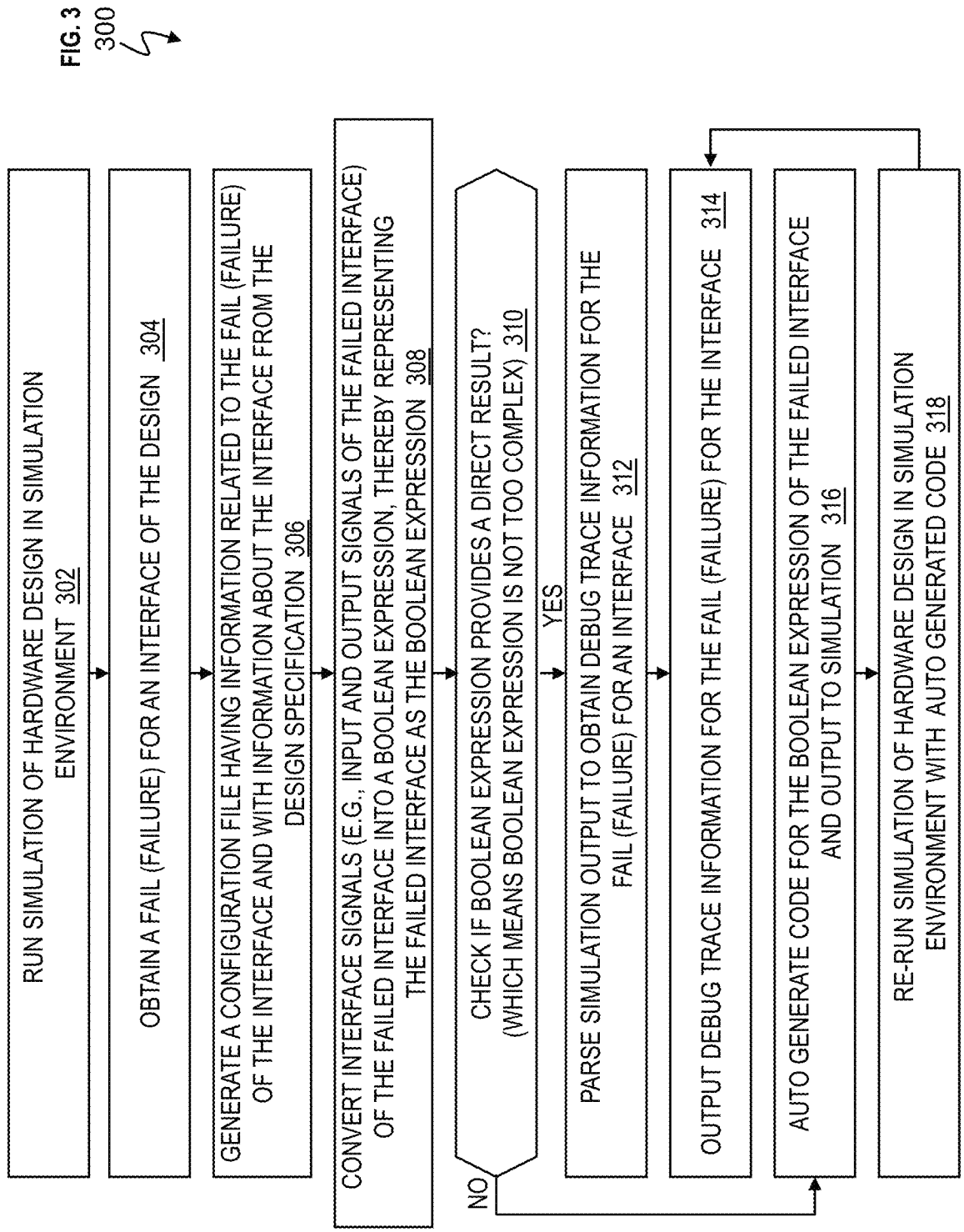
FIG. 3 is a flowchart of a process for auto generation of a debug trace in pre-silicon verification, thereby providing debug trace information for a design of an IC in order to fabricate the IC according to one or more embodiments of the present invention.

FIG. 3 is a flowchart of a process 300 for auto generation of a debug trace in pre-silicon verification, thereby providing debug trace information for a design of an IC in order to fabricate the IC according to one or more embodiments of the invention. Reference can be made to computer system 200 in FIG. 2.

At block 302, software applications 204 are configured to cause and/or instruct EDA tools 206 to perform a simulation of hardware design 220 in a simulation environment 210 as understood by one of ordinary skill in the art. The simulation environment 210 may include a verification simulator 212 for verifying the design 220. The simulation of design 220 results in a simulation output 214. The simulation output 214 can be representative of various outputs. Simulation output 214 has many additional files including a value change dump (VCD) file. In addition to the VCD file, simulation output 214 includes a test file (whatever input test was given to the design) and a trace file which includes cycle-by-cycle information in text as events are happening in the design based on the test input. An event includes and/or captures a state of one or more signals at a given time. One or more embodiments of the invention are configured to generate another custom trace with additional information related to some specific fail (failure) as discussed further herein.

At block 304, software applications 204 are configured to parse the simulation output 214 to obtain a fail (failure) of an interface in design 220. At block 306, software applications 204 are configured to generate a configuration file 230 (and/or cause the EDA tools 206 to generate the configuration file 230) having information related to the fail (failure) of the interface in design 220 and with information about the interface from a design specification 224 of design 220. Information obtained from the design specification 224 for signals may include the signal name of the event related interface, the signal width, the temporal behavior, etc. Design 220 can have multiple units (or subunits) which talk (i.e., communicate) to each other while processing data. An interface in the design can be thought of as the input and output signals between two units (or subunits) in the design. Units have certain rules which the units follow while processing data. A fail (failure) related to an interface may occur because the interface did not follow the correct rule in the design specification 224 for the design 220 while processing data.

Example file formats for configuration files are illustrated in FIGS. 4 and 5. In FIG. 5, there are various interface signals including input signal 1, input signal 2, output signal 1, and output signal 2. The interface signals can be transmitted between units or subunits. For example, if there is an interface between unit X and unit Y and if the rules/behaviors of that interface are divided into 4 separate behaviors, then the software applications 204 are configured to generated the configuration file with 4 different pieces of information from the design specification 224; each piece has information which can include the input value, the output value, the number of cycles taken to obtain the input value, and the number of cycles taken to obtain the output value, etc. After running the simulation, when the simulation output fail error matches one of the above 4 behaviors, software applications 204 are configured to select that specific information (which is the matched behavior and the information for the fail) from the configuration file to (eventually) generate code. The code is generated automatically and added into the simulation environment which can be recompiled to re-simulate and obtain the debug trace.

At block 308, software applications 204 are configured to convert interface signals of the failed interface into a Boolean expression, thereby representing the interface as a Boolean expression. Examples of the interface signals representing the interface include input signals, output signals, event signals, number of cycles to obtain input signals, number of cycles to obtain output signals.

For the interface behavior conversion into a Boolean expression, the key interface signals of the different behaviors of the interface can be standardized in the configuration file. For example, the rule/behavior may be "if signal P is active at time reference 0 and signal Q is active at time reference 1, then it (e.g., the interface) should get the correct expected data in signals R and S at time reference 2". So, if the fail happens related to this behavior, then the values of signals R and S are important for debugging the fail. So, for that behavior, the configuration file (e.g., JSON file or any other file) should have the following: the number of event signals (e.g., how many events signals there are), each event signal with its time reference (e.g., timestamp), and the number of output signals (e.g., how many output signals there are), and the time reference (i.e., cycle delay from input time reference 0) for each of the output signals, etc.

Accordingly, software applications 204 are configured to generate the Boolean expression condition. For example, the Boolean expression condition can be "if 'Event P is active' AND 'Event Q is active' with cycle delay 1, then read output signal R and S with cycle delay 2 and then dump the output in the custom trace (e.g., custom trace file 250) when all is true. The above is an example interface behavior illustrated for explanation purposes and ease of understanding, and it should be understood that interface behavior can be more complex.

At block 310, software applications 204 are configured to check if the Boolean expression provides a direct result, which means the Boolean expression is not too complex. Software applications 204 can check rules/conditions 232 to determine if the Boolean expression provides a direct result.

At block 312, if the Boolean expression of the failed interface is a direct result (i.e., is not too complex), software applications 204 are configured to parse and/or cause a parser to parse the simulation output 214 to obtain debug trace information for the fail (failure) of the interface.

For example, using rules/conditions 232, to determine if the Boolean expression is too complex, software applications 204 may check the Boolean expression to determine if there is no time difference between different input signal(s) and output signal(s) and/or if there is only one Event signal. After determining that there is no time difference between different input signal(s) and output signal(s) and/or after determining that there is only one Event signal, then software applications 204 are configured to determine that the Boolean expression is a simple Boolean expression (i.e., not complex) and auto code generation is not needed. Particularly, software applications 204 can determine that there is no time difference between two input signals received at the interface, which is determined to be a direct result or simple case. Software applications 204 can determine there is no time difference (e.g., greater than a predetermined threshold) between an input signal and an output signal, which is determined to be a direct result or simple case. Software applications 204 can determine that there is no time difference between two output signals from the interface, which is determined to be a direct result or simple case. Accordingly, when the Boolean expression is determined to be a direct result or simple case, the required information can be obtained from simulation output 214 (e.g., the VCD file) and dumped into a custom trace file 250. As such, at block 314, software applications 204 are configured to retrieve the debug trace information of the fail (failure) for the interface of design 220 from the simulation output 214 and place in the custom trace file 250.

At block 316, if the Boolean expression does not provide a direct result (i.e., the Boolean expression too complex), software applications 204 are configured to cause/instruct an auto code generator 240 to automatically generate code 242 (e.g., Python, C++, etc.) for the Boolean expression of the failed interface and output the code to the verification simulator 212. For example, for the Boolean expression determined to not provide a direct result or that is too complex, software applications 204 determine there is a time difference between different input signal(s) and output signal(s) and/or there is more than just one Event signal. Particularly, software applications 204 can determine that there is a time difference (greater than a predetermined threshold) between two input signals received at the interface, which is determined to not be a direct result and is therefore a complex case. Software applications 204 can determine there is a time difference (e.g., greater than a predetermined threshold) between an input signal and an output signal, which is determined not to be a direct result and is therefore a complex case. Software applications 204 can determine that there is a time difference (e.g., greater than a predetermined threshold) between two output signals from the interface, which is determined not to be a direct result and is therefore a complex case.

Auto code generator 240 includes an auto code generator script that is configured with the knowledge (or instructions) to check (and retrieve from) the configuration file 230 for which (failed) behavior to look for, how many event signals are present, and is there any time delay between the event signals. After doing this, auto code generator 240 is configured to create the Boolean expression (discussed above) and get the output data from mentioned signals from configuration file. Again, the auto code generator 240 has the knowledge that is there is, for example, a cycle delay (e.g., the cycle delay indicates a time difference) in the output signals; as such, the auto code generator 240 is configured to generate auto code 242.

An example Boolean expression generated from the configuration file in FIG. 5 is determined to not be a direct result and to instead be a complex case, because the cycle delay of 3 is the time difference between input interface signal (i.e., input signal 1) and the output interface signal (i.e., output signal 2). Further, the configuration file in FIG. 5 can be designated with a category "complex".

At block 318, software applications 204 are configured to cause/instruct/request the simulation of EDA tools 206 to rerun the simulation of hardware design 220 in the simulation environment 210 with the auto generated code 242, to thereby provide debug trace information in the custom trace file 250.

As understood by one of ordinary skill in the art, the simulation uses a model to run the simulation of design 220. The model can be integrated in the verification simulator 212. Software applications 204 (and/or auto code generator 240) are configured to pass the auto generated code 242 to the verification simulator 212. The verification simulator 212 recompiles the model (i.e., source code) with the generated auto code 242 and reruns the simulation. After rerunning the simulation, the fail directory now has a separate debug trace file (i.e., designated as custom trace file 250) with the required information for each time cycle, in addition to the already generated trace which does not have the required information. This means that whenever that behavior/event is active, the behavior/event will dump the output value(s) for that time cycle into the new custom trace file 250. In one or more embodiments, the user can also have the flexibility to dump the output value(s) in the existing trace file. The original simulation output may not have this interface information because the original simulation lacks such behaviors (in a complex design simulation) inside the different unit interfaces, and the original simulation may or may not see any rule/behavior violation. In accordance with one or more embodiments, the auto generated code 242 is configured to guarantee that the output value(s) for desired behavior/event is stored in custom trace file 250.

An example of the debug trace information stored in the custom trace file 250 for the failed interface may include input values, output values, cycles (i.e., the number of cycles), event signals or events, etc. An example debug trace text file or custom trace file 250 is depicted in FIG. 11. Using the debug trace information in the custom trace file 250, a design tool 216 of the EDA tools 206 can be utilized to correct the design 220 of the IC based on the debug trace information in the custom trace file 250, which may include fixing one or more of the units connected to the interface (e.g., the interface may connect unit X and unit Y, and one or more of these units is fixed in the design). The corrected design 220 of the IC is used to fabricate the IC. The IC may be a semiconductor structure having an interconnection of various devices as understood by one of ordinary skill in the art.

Figure 6:
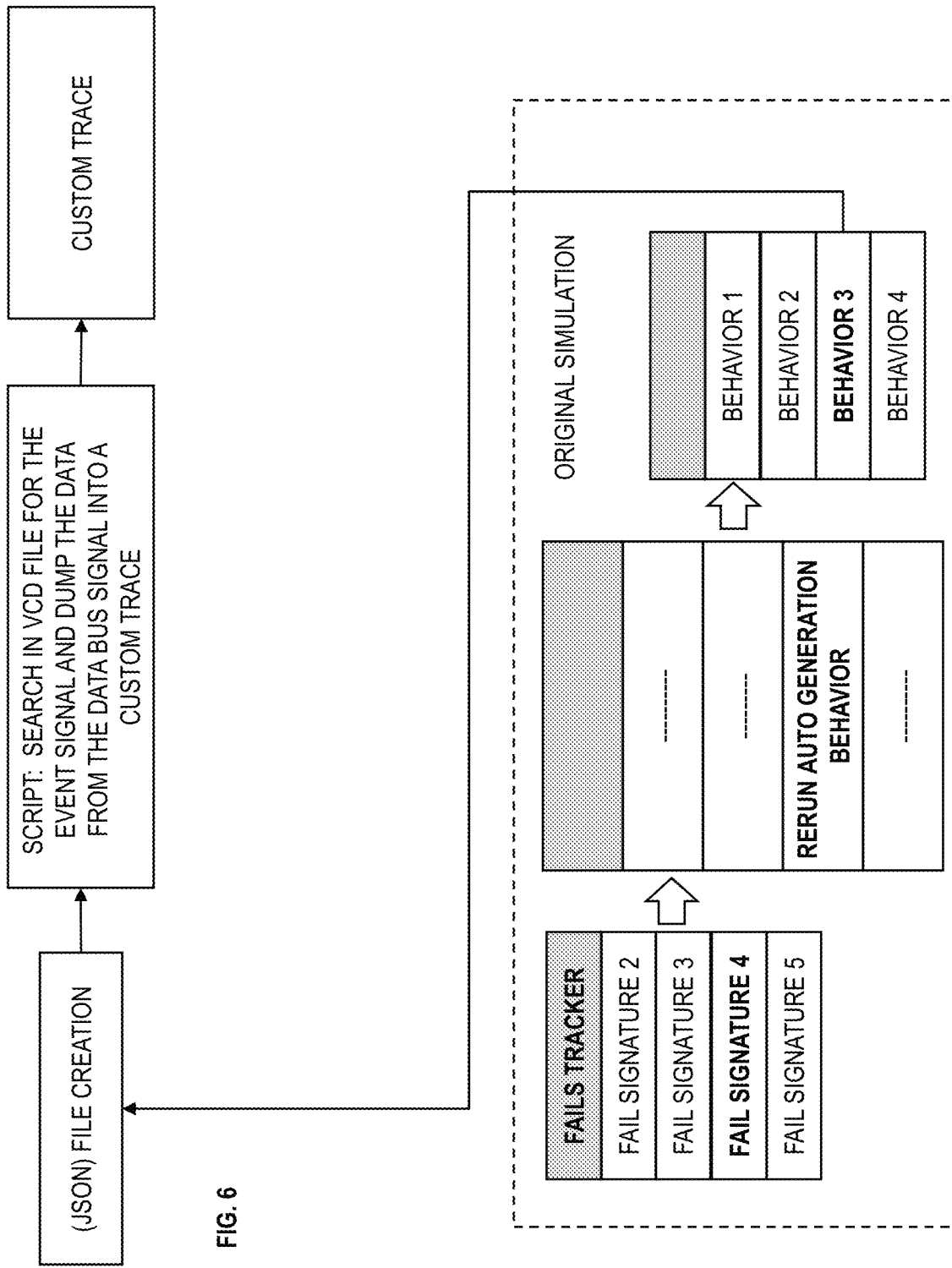
FIG. 6 depicts a block diagram of an example in which the interface is a direct result (or simple) according to one or more embodiments of the present invention.

FIG. 6 is a block diagram of an example in which the interface is a direct result (or simple) according to one or more embodiments of the invention. As noted above, EDA tools 206 are used to run the (initial) simulation of design 220 in simulation environment 210. In FIG. 6, a fails tracker tracks the fails of various test conducted on design 220 by verification simulator 212. Each fail (failure) of an interface has a fail signature. In some examples, the fail signature may include a memory_Write_created_multihit, design signals checker fails like <Design signal> mismatch expected versus actual, etc. For a given fail signature such as the fail signature 4 for a failed interface, EDA tools 206 are configured to rerun auto generation behavior for the failed interface which results in the behavior of the failed interface, such as behavior 3. Rerunning the auto generation will automatically generate auto code that in turn is recompiled and re-simulated to obtain the custom trace. Behavior 3 includes all the logic signals on the interface. The logic signals may be called interface signals (or values). Some of the logic signals can be failed interface signals (or values).

As noted above, software applications 204 (or some other software) are configured to extract the failed interface signals from behavior 3 and then pass the failed interface signals to the configuration file 230. Interface signals can be coupled with different behaviors, where one of the behaviors is linked to the fail signature. As such, whenever a particular fail error occurs, software applications 204 can distinguish legal interface signals versus illegal interface signals. The configuration file that is created can be a JSON file, such as the configuration file illustrated in FIG. 4. A Boolean expression representing the failed interface has been created, and it is determined that the Boolean expression meets the rules/conditions 232 for not generating auto code. Using information (including the event signal) from configuration file 230, software applications 204 have a script that is configured to search in the VCD file of simulation output 214 for the event signal and then dump the data from the data bus signal into the custom debug trace in the custom trace file 250, as depicted in FIG. 6.

Figure 7:
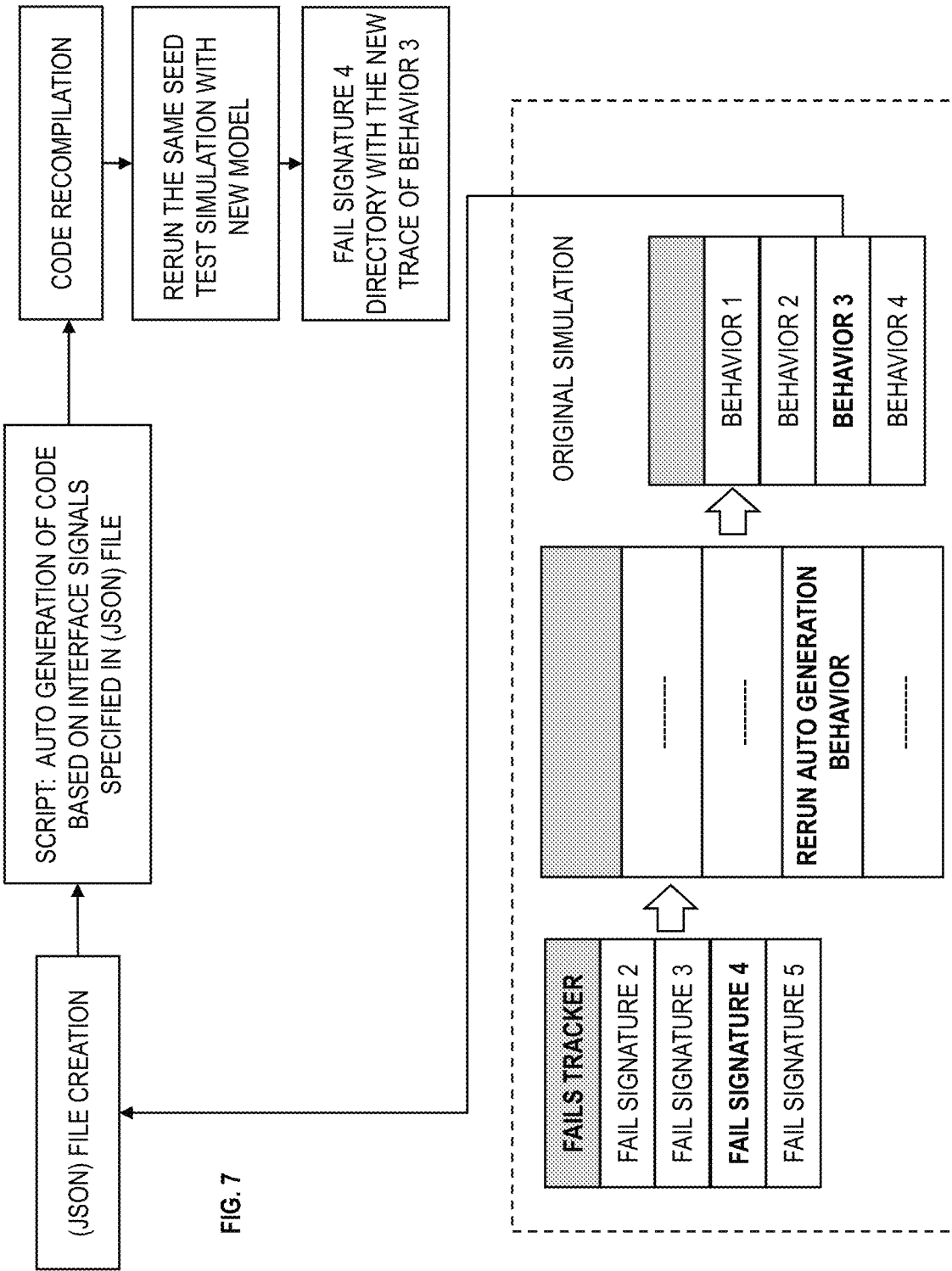
FIG. 7 depicts a block diagram of an example in which the interface is not a direct result (or complex) according to one or more embodiments of the present invention.

FIG. 7 is a block diagram of an example in which the interface is not a direct result (i.e., is complex case) according to one or more embodiments of the invention. As noted above, EDA tools 206 are used to run the simulation of design 220 in simulation environment 210. In FIG. 7, a fails tracker tracks the fails of various test conducted on design 220 by verification simulator 212. Each fail (failure) of an interface has a fail signature. For a given fail signature such as the fail signature 4 for a failed interface, EDA tools 206 are configured to rerun auto generation behavior for the failed interface which results in the behavior of the failed interface, such as behavior 3. Behavior 3 includes all the logic signals on the interface. The logic signals may be called interface signals (or values). Some of the logic signals can be failed interface signals (or values).

As noted above, software applications 204 (or some other software) are configured to extract the failed interface signals from behavior 3 and then pass the failed interface signals to the configuration file 230. The configuration file that is created can be a JSON file, such as the configuration file illustrated in FIG. 5. It is noted that the example configuration file in FIG. 5 is more complex than the configuration file in FIG. 4. A Boolean expression representing the failed interface has been created, and it is determined that the Boolean expression meets the rules/conditions 232 for generating auto code (i.e., this is a complex case). As such, auto code generator 240 is configured to run a script that automatically generates code based on the interface signals in the configuration file 230 and/or the Boolean expression.

Auto code generator 240 extracts the information from the configuration file 230 and creates a new coding file or adds the extracted information inside an existing coding file which contains not only the Boolean expression condition but also the standard simulation environment code which is needed to generate the debug trace. In FIG. 7, software applications 204 are configured to send the auto generated code 242 to the verification simulator 212 for recompilation. Verification simulator 212 recompiles its original source code along with the additional auto generated code 242, resulting in a new model. Verification simulator 212 is configured to rerun the same seed test simulation (originally run test) for design 220 with the new model that now includes the auto generated code 242, which results in the custom debug trace stored in custom trace file 250. In one or more embodiments, after rerunning the simulation, the custom debug trace may be output to the fail signature 4 directory with the new (custom) trace of behavior 3.

Figure 8:
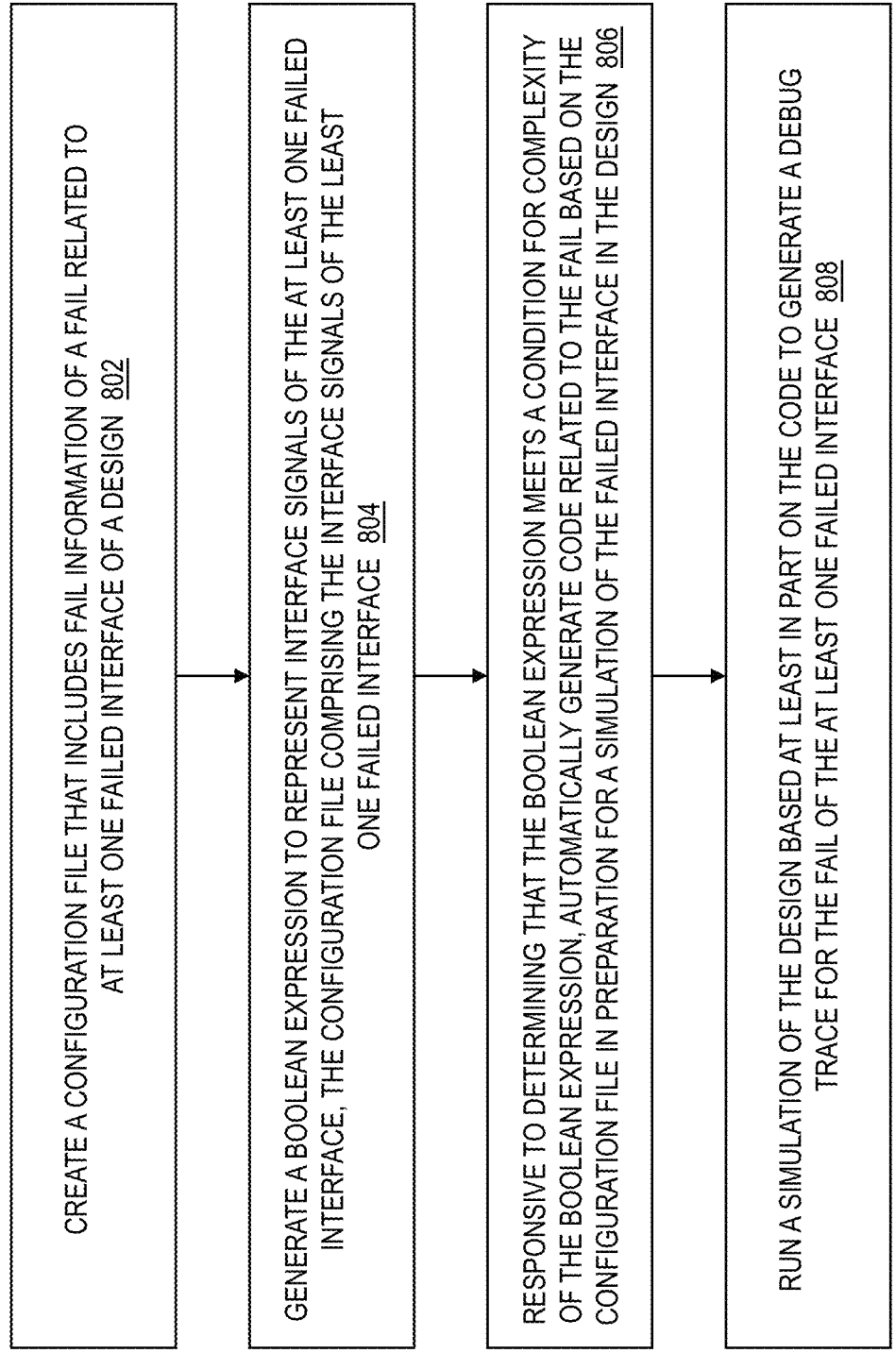
FIG. 8 is a flowchart of a computer-implemented method for auto generation of a debug trace in pre-silicon verification, thereby providing debug trace information for a design of an IC in order to fabricate the IC according to one or more embodiments of the present invention.

FIG. 8 is a flowchart of a method 800 for auto generation of a debug trace in pre-silicon verification for a design 220 of an IC, resulting in fabrication of the IC according to one or more embodiments. At block 802, software applications 204 are configured to create a configuration file 230 that includes fail information of a fail related to at least one failed interface of a design 220. At block 804, software applications 204 are configured to generate a Boolean expression to represent interface signals of the at least one failed interface, the configuration file comprising the interface signals of the least one failed interface. At block 806, software applications 204 are configured (and/or cause auto code generator 240) to, responsive to determining that the Boolean expression meets a condition for complexity of the Boolean expression, automatically generate code (e.g., auto generated code 242) related to the fail based on the configuration file in preparation for a simulation of the failed interface in the design. At block 808, software applications 204 are configured to cause running of a simulation of the design 220 (e.g., cause EDA tools 206 to simulate the design 220 in the simulation environment 210) based at least in part on the code (e.g., auto generated code 242) to generate a debug trace (e.g., in custom trace file 250) for the fail of the at least one failed interface.

The fail (i.e., failure and/or failed test) occurred in a previous simulation of the design 220. In one example, the interface signals comprise at least one input signal, at least one output signal, and at least one event signal. In another example, the interface signals comprise at least one input signal, at least one output signal, at least one event signal, and at least one cycle delay signal. The debug trace (i.e., custom debug trace) of the failed interface comprises at least one output signal and at least one event signal. An event signal (corresponds to the event source) of the interface signals precedes an input signal of the interface signals, as depicted in FIGS. 4 and 5. Responsive to determining that the Boolean expression does not meet the condition for the complexity of the Boolean expression, software applications 204 are configured to parse a simulation output 214 of a previous simulation to obtain the debug trace of the failed interface.

Figure 9:
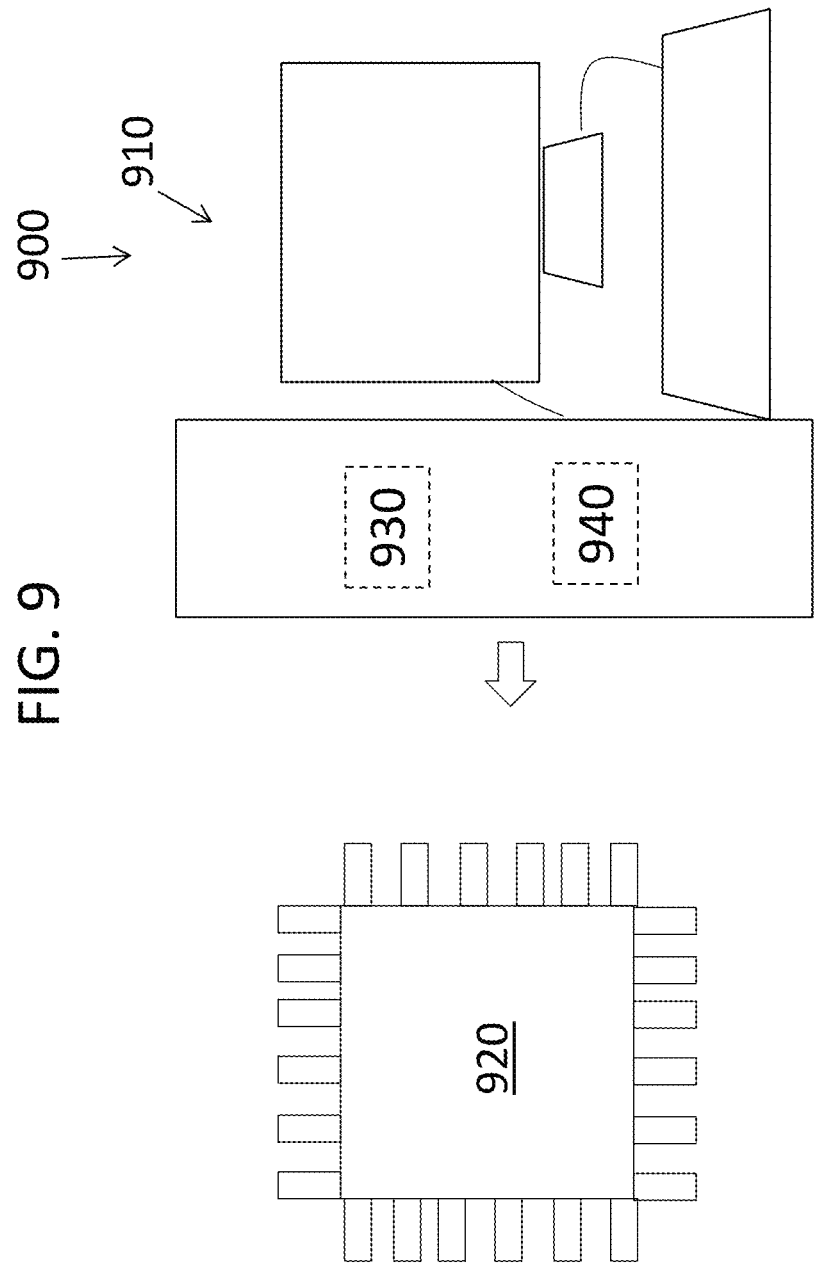
FIG. 9 is a block diagram of a system to design/layout a portion of an IC using auto generation of a debug trace in pre-silicon verification in accordance with one or more embodiments of the present invention.

FIG. 9 is a block diagram of a system 900 according to embodiments of the invention. The system 900 includes processing circuitry 910 used to generate the design 930 that is ultimately fabricated into an integrated circuit, which can include a variety of active semiconductor devices. The steps involved in the fabrication of the integrated circuit 920 are well-known and briefly described herein. Once the physical layout 940 is finalized, based, in part, on utilizing auto generation of a debug trace in pre-silicon verification for the design according to embodiments of the invention, the finalized physical layout 940 is provided to a foundry. Masks are generated for each layer of the integrated circuit based on the finalized physical layout. Then, the wafer is processed in the sequence of the mask order. The processing includes photolithography and etch. This is further discussed with reference to FIG. 10.

Figure 10:
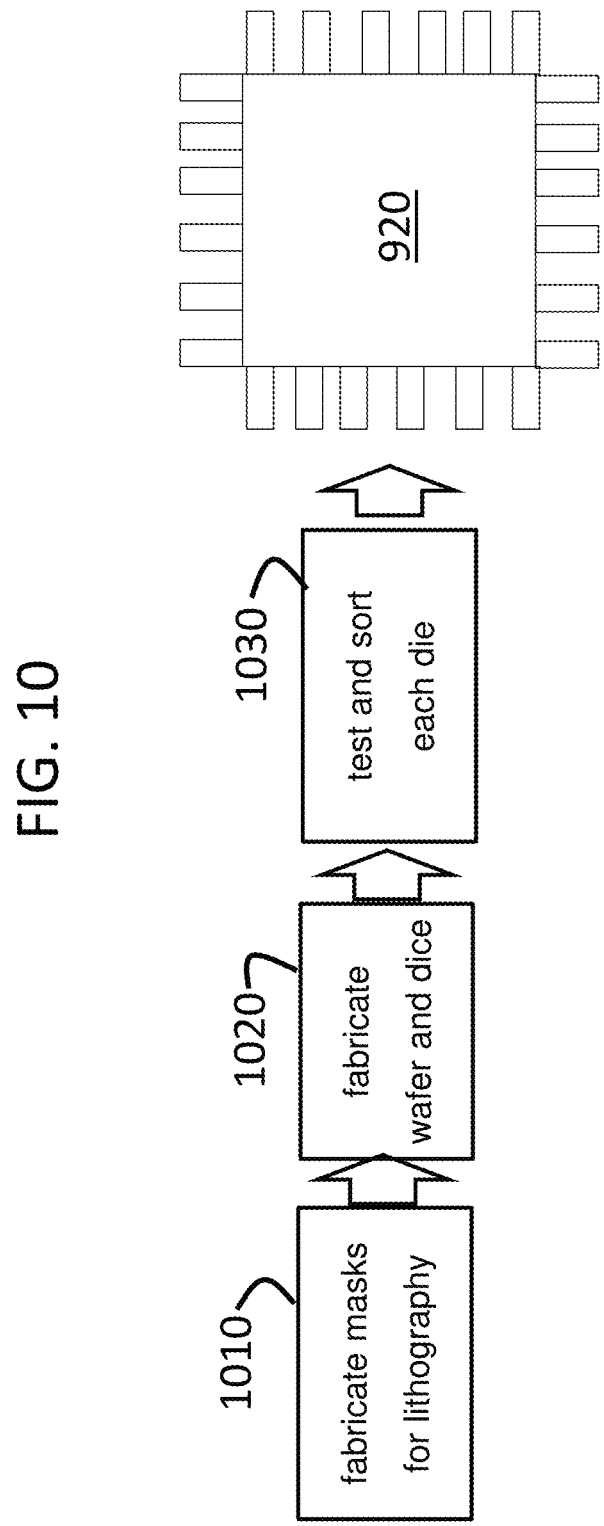
FIG. 10 is a process flow of a method of fabricating the IC of FIG. 9 in accordance with one or more embodiments of the present invention.

FIG. 10 is a process flow of a method of fabricating the integrated circuit according to exemplary embodiments of the invention. Once the physical design data is obtained, based, in part, utilizing auto generation of a debug trace in pre-silicon verification for a design, the integrated circuit 920 can be fabricated according to known processes that are generally described with reference to FIG. 10. Generally, a wafer with multiple copies of the final design is fabricated and cut (i.e., diced) such that each die is one copy of the integrated circuit 920. At block 1010, the processes include fabricating masks for lithography based on the finalized physical layout. At block 1020, fabricating the wafer includes using the masks to perform photolithography and etching. Once the wafer is diced, testing and sorting each die is performed, at block 1030, to filter out any faulty die.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The phrase "selective to," such as, for example, "a first element selective to a second element," means that the first element can be etched and the second element can act as an etch stop.

As used herein, "p-type" refers to the addition of impurities to an intrinsic semiconductor that creates deficiencies of valence electrons. In a silicon-containing substrate, examples of p-type dopants, i.e., impurities, include but are not limited to: boron, aluminum, gallium and indium.

As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device.

As noted above, atomic layer etching processes can be used in the present invention for via residue removal, such as can be caused by via misalignment. The atomic layer etch process provide precise etching of metals using a plasma-based approach or an electrochemical approach. The atomic layer etching processes are generally defined by two well-defined, sequential, self-limiting reaction steps that can be independently controlled. The process generally includes passivation followed selective removal of the passivation layer and can be used to remove thin metal layers on the order of nanometers. An exemplary plasma-based approach generally includes a two-step process that generally includes exposing a metal such a copper to chlorine and hydrogen plasmas at low temperature (below 20° C.). This process generates a volatile etch product that minimizes surface contamination. In another example, cyclic exposure to an oxidant and hexafluoroacetylacetone (Hhfac) at an elevated temperature such as at 275° C. can be used to selectively etch a metal such as copper. An exemplary electrochemical approach also can include two steps. A first step includes surface-limited sulfidization of the metal such as copper to form a metal sulfide, e.g., $Cu_2S$, followed by selective wet etching of the metal sulfide, e.g., etching of $Cu_2S$ in HCl. Atomic layer etching is relatively recent technology and optimization for a specific metal is well within the skill of those in the art. The reactions at the surface provide high selectivity and minimal or no attack of exposed dielectric surfaces.

Semiconductor lithography is the formation of three-dimensional relief images or patterns on the semiconductor substrate for subsequent transfer of the pattern to the substrate. In semiconductor lithography, the patterns are formed by a light sensitive polymer called a photoresist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The photoresist can be formed using conventional deposition techniques such chemical vapor deposition, plasma vapor deposition, sputtering, dip coating, spin-on coating, brushing, spraying and other like deposition techniques can be employed. Following formation of the photoresist, the photoresist is exposed to a desired pattern of radiation such as X-ray radiation, extreme ultraviolet (EUV) radiation, electron beam radiation or the like. Next, the exposed photoresist is developed utilizing a conventional resist development process.

After the development step, the etching step can be performed to transfer the pattern from the patterned photoresist into the interlayer dielectric. The etching step used in forming the at least one opening can include a dry etching process (including, for example, reactive ion etching, ion beam etching, plasma etching or laser ablation), a wet chemical etching process or any combination thereof.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

In some embodiments, various functions or acts can take place at a given location and/or in connection with the operation of one or more apparatuses or systems. In some embodiments, a portion of a given function or act can be performed at a first device or location, and the remainder of the function or act can be performed at one or more additional devices or locations.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The present disclosure has been presented for purposes of illustration and description, but is not intended to be exhaustive or limited to the form disclosed. Many modifications and variations will be apparent to those of ordinary skill in the art without departing from the scope and spirit of the disclosure. The embodiments were chosen and described in order to best explain the principles of the disclosure and the practical application, and to enable others of ordinary skill in the art to understand the disclosure for various embodiments with various modifications as are suited to the particular use contemplated.

The diagrams depicted herein are illustrative. There can be many variations to the diagram or the steps (or operations) described therein without departing from the spirit of the disclosure. For instance, the actions can be performed in a differing order or actions can be added, deleted or modified. Also, the term "coupled" describes having a signal path between two elements and does not imply a direct connection between the elements with no intervening elements/connections therebetween. All of these variations are considered a part of the present disclosure.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e., two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A computer-implemented method comprising:
    creating a configuration file that includes fail information of a fail related to at least one failed interface of a design;
    generating a Boolean expression to represent interface signals of the at least one failed interface, the configuration file comprising the interface signals of the least one failed interface;
    responsive to determining that the Boolean expression meets a condition for complexity of the Boolean expression, automatically generating code related to the fail based on the configuration file in preparation for a simulation of the at least one failed interface in the design; and
    running the simulation of the design based at least in part on the code to generate a debug trace for the fail of the at least one failed interface.

2. The computer-implemented method of claim 1, wherein the fail occurred in a previous simulation of the design.

3. The computer-implemented method of claim 1, wherein the interface signals comprise at least one input signal, at least one output signal, and at least one event signal.

4. The computer-implemented method of claim 1, wherein the interface signals comprise at least one input signal, at least one output signal, at least one event signal, and at least one cycle delay signal.

5. The computer-implemented method of claim 1, wherein the debug trace of the at least one failed interface comprises at least one output signal and at least one event signal.

6. The computer-implemented method of claim 1, wherein an event signal of the interface signals precedes an input signal of the interface signals.

7. The computer-implemented method of claim 1, further comprising:
    responsive to determining that the Boolean expression does not meet the condition for the complexity of the Boolean expression, parsing a simulation output of a previous simulation to obtain the debug trace of the at least one failed interface.

8. A system comprising:
    a memory having computer readable instructions; and
    one or more processors for executing the computer readable instructions, the computer readable instructions controlling the one or more processors to perform operations comprising:
        creating a configuration file that includes fail information of a fail related to at least one failed interface of a design;
        generating a Boolean expression to represent interface signals of the at least one failed interface, the configuration file comprising the interface signals of the least one failed interface;
        responsive to determining that the Boolean expression meets a condition for complexity of the Boolean expression, automatically generating code related to the at least one fail based on the configuration file in preparation for a simulation of the at least one failed interface in the design; and
        running the simulation of the design based at least in part on the code to generate a debug trace for the fail of the at least one failed interface.

9. The system of claim 8, wherein the fail occurred in a previous simulation of the design.

10. The system of claim 8, wherein the interface signals comprise at least one input signal, at least one output signal, and at least one event signal.

11. The system of claim 8, wherein the interface signals comprise at least one input signal, at least one output signal, at least one event signal, and at least one cycle delay signal.

12. The system of claim 8, wherein the debug trace of the at least one failed interface comprises at least one output signal and at least one event signal.

13. The system of claim 8, wherein an event signal of the interface signals precedes an input signal of the interface signals.

14. The system of claim 8, further comprising:
responsive to determining that the Boolean expression does not meet the condition for the complexity of the Boolean expression, parsing a simulation output of a previous simulation to obtain the debug trace of the at least one failed interface.

15. A computer program product comprising a computer readable storage medium having program instructions embodied therewith, the program instructions executable by one or more processors to cause the one or more processors to perform operations comprising:
creating a configuration file that includes fail information of a fail related to at least one failed interface of a design;
generating a Boolean expression to represent interface signals of the at least one failed interface, the configuration file comprising the interface signals of the least one failed interface;
responsive to determining that the Boolean expression meets a condition for complexity of the Boolean expression, automatically generating code related to the at least one fail based on the configuration file in preparation for a simulation of the at least one failed interface in the design; and
running the simulation of the design based at least in part on the code to generate a debug trace for the fail of the at least one failed interface.

16. The computer program product of claim 15, wherein the fail occurred in a previous simulation of the design.

17. The computer program product of claim 15, wherein the interface signals comprise at least one input signal, at least one output signal, and at least one event signal.

18. The computer program product of claim 15, wherein the interface signals comprise at least one input signal, at least one output signal, at least one event signal, and at least one cycle delay signal.

19. The computer program product of claim 15, wherein the debug trace of the at least one failed interface comprises at least one output signal and at least one event signal.

20. The computer program product of claim 15, further comprising:
responsive to determining that the Boolean expression does not meet the condition for the complexity of the Boolean expression, parsing a simulation output of a previous simulation to obtain the debug trace of the at least one failed interface.

* * * * *